(12) United States Patent
Choi et al.

(10) Patent No.: US 8,711,618 B2
(45) Date of Patent: Apr. 29, 2014

(54) METHOD FOR PROGRAMMING NON-VOLATILE MEMORY DEVICE AND APPARATUSES PERFORMING THE METHOD

(75) Inventors: Seong Hyeog Choi, Hwaseong-si (KR); Hong Rak Son, Anyang-si (KR); Jun Jin Kong, Yongin-si (KR); Yong June Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 315 days.

(21) Appl. No.: 13/190,913

(22) Filed: Jul. 26, 2011

(65) Prior Publication Data

US 2012/0020156 A1    Jan. 26, 2012

(30) Foreign Application Priority Data

Jul. 26, 2010  (KR) .......................... 10-2010-0071770

(51) Int. Cl.
*G11C 7/10*     (2006.01)

(52) U.S. Cl.
USPC ................... 365/185.03; 365/189.08; 365/200

(58) Field of Classification Search
USPC ................................ 365/185.03, 189.08, 200
See application file for complete search history.

(56) References Cited

U.S. PATENT DOCUMENTS

| | | | |
|---|---|---|---|
| 6,330,185 B1 * | 12/2001 | Wong et al. | ............... 365/185.03 |
| 7,366,013 B2 | 4/2008 | Roohparvar | |
| 7,532,495 B2 * | 5/2009 | Youn et al. | ....................... 365/63 |
| 7,545,673 B2 | 6/2009 | Lasser | |
| 2009/0168513 A1 | 7/2009 | Tanaka | |
| 2009/0300269 A1 | 12/2009 | Radke et al. | |

* cited by examiner

*Primary Examiner* — Son Dinh
*Assistant Examiner* — Nam Nguyen
(74) *Attorney, Agent, or Firm* — Harness, Dickey & Pierce, P.L.C.

(57) ABSTRACT

A method of programming multi-level cells included in a spare region, the method including programming first page data and at least one first dummy data in a first multi-level cell; and programming second page data and at least one second dummy data in a second multi-level cell.

17 Claims, 23 Drawing Sheets

FIG. 7

| | dummy2 | | | dummy2 | |
|---|---|---|---|---|---|
| 44-1 | ① | 1 | | ⓪ | 0 |
| 44-2 | ① | 0 | | ⓪ | 1 |
| | vd2 | | | vd2 | |

METHOD FOR PROGRAMMING NON-VOLATILE MEMORY DEVICE AND APPARATUSES PERFORMING THE METHOD

CROSS-REFERENCE TO RELATED APPLICATIONS

This application claims priority under 35 U.S.C. §119(e) (or 35 U.S.C. §120) to Korean Patent Application No. 10-2010-0071770 filed on Jul. 26, 2010, in the Korean Intellectual Property Office (KIPO), the entire contents of which are incorporated herein by reference.

BACKGROUND

Example embodiments relate to memory devices, and more particularly, to a method of programming a spare region of a memory device, and apparatuses capable of performing the method.

Flash memory is widely used as a storage medium of an electronic apparatus which is one of non-volatile memory devices. Metadata of firmware or software necessary for an operational algorithm of the flash memory is stored in the spare region of the flash memory. When the metadata is programmed in a multi-level cell included in the spare region, the integrity of the metadata is lower than when the metadata is programmed in a SLC. Moreover, since the metadata has a limit in hardware, the number of methods capable of securing the integrity of the metadata is smaller than that of methods capable of securing the integrity of user data stored in a main region of the flash memory.

SUMMARY

Some example embodiments provide a method of programming multi-level cells included in a spare region of a non-volatile memory device and apparatuses capable of performing the method.

According to some example embodiments, there is provided a method of programming multi-level cells included in a spare region, the method comprising programming first page data and at least one first dummy data in a first multi-level cell; and programming second page data and at least one second dummy data in a second multi-level cell.

According to some example embodiments, the method further comprises programming third page data and at least one third dummy data in a third multi-level cell.

According to some example embodiments, the first page data, the second page data, and the third page data are sequentially programmed in the first multi-level cell, the second multi-level cell, and the third multi-level cell.

According to some example embodiments, the programming in the first multi-level cell comprises programming the first page data as a first bit in the first multi-level cell; reading the first bit programmed in the first multi-level cell; and programming the first dummy data in the first multi-level cell as a second bit of the first multi-level cell according to read the first bit.

According to some example embodiments, the programming in the first multi-level cell further comprises programming third dummy data as a third bit in the first multi-level cell according to the first and second bits of the first multi level cell.

According to some example embodiments, the programming the second page data comprises reading data from the second multi-level cell being in an erased state; changing the read-out data to the second page data and storing the changed read-out data as the second dummy data in a latch connected to the second multi-level cell; and programming the second page data in the second multi-level cell and the second dummy data as a first bit and a second bit of the second multi-level cell.

According to some example embodiments, the programming in the second multi-level cell further comprises programming third dummy data as a third bit in the second multi-level cell according to the first and second bits of the second multi-level cell.

According to some example embodiments, the programming in the third multi-level cell comprises reading data from the third multi-level cell being in an erased state; changing the read-out data to the third page data and storing the changed read-out data as the third dummy data and fourth dummy data in a plurality of latches connected to the third multi-level cell respectively; and programming the third page data and the third and fourth dummy data in the third multi-level cell as a first bit, a second bit, and a third bit in the third multi-level cell.

According some example embodiments, there is provided a non-volatile memory device comprising a spare region including a first multi-level cell and a second multi-level cell; and a control logic configured to control programming of first page data and at least one first dummy data in the first multi-level cell and programming of second page data and at least one second dummy data to be programmed in the second multi-level cell.

According to some example embodiments, the spare region further includes a third multi-level cell, and the control logic if further configured to control programming of third page data and at least one third dummy data in the third multi-level cell.

According to some example embodiments, the control logic is configured to control programming of the first page data, the second page data, and the third page data such that the first page data, the second page data, and the third page data are sequentially programmed in the first multi-level cell, the second multi-level cell, and the third multi-level cell.

According to some example embodiments, the control logic comprises a page data control logic configured to control programming of the first page data in the first multi-level cell as a first bit of the first multi-level cell and reading of the first bit of the first multi-level cell; and a dummy data control logic configured to control programming of the first dummy data in the first multi-level cell as a second bit of the first multi-level cell according to the first bit.

According to some example embodiments, the dummy data control logic is configured to control programming of third dummy data in the first multi-level cell as a third bit of the first multi-level cell according to the first and second bits.

According to some example embodiments, the control logic comprises a dummy data control logic configured to control reading of controls data of the second multi-level cell in an erased state, configured to control changing of the read-out data to the second page data, and configured to control storing of the changed read-out data as the second dummy data in a latch connected to the second multi-level cell; and a page data control logic configured to control programming of the second dummy data and the second dummy data in the second multi-level cell as a first bit and a second bit in the second multi-level cell.

According to some example embodiments, the dummy data control logic is configured to control programming of third dummy data as a third bit in the second multi-level cell according to the first and second bits.

According to some example embodiments, the control logic comprises a dummy data control logic configured to control reading of data of the third multi-level cell in an erased state, configured to control changing of the read-out data to the third page data, and configured to control storing of the changed read-out data as the third and fourth dummy data in a plurality of latches connected to the third multi-level cell; and a data page control logic configured to control programming of the third page data and the third and fourth dummy data in the third multi-level cell as a first bit, a second bit, and a third bit in the third multi-level cell.

According to some example embodiments, there is provided an electronic device comprising a non-volatile memory device; and a processor capable of controlling an operation of the non-volatile memory device.

According to some example embodiments, the non-volatile memory device includes a spare region comprising a first multi-level cell and a second multi-level cell; and a control logic configured to control programming of first page data and at least one first dummy data in the first multi-level cell and second page data and programming of at least one second dummy data in the second multi-level cell.

According to some example embodiments, the spare region further include a third multi-level cell, and the control logic is configured to control programming of third page data and at least one third dummy data in the third multi-level cell.

According to some example embodiments, there is provided a three-dimensional non-volatile memory device comprising a plurality of layers each including a main region and a spare region, at least one of the spare regions including a first multi-level cell, a second multi-level cell, and a third multi-level cell; and a control logic configured to control programming of first page data and at least one first dummy data in the first multi-level cell, configured to control programming of second page data and at least one second dummy data in the second multi-level cell, and third page data and at least one third dummy data to be programmed in the third multi-level cell.

According to some example embodiments, a non-volatile memory device comprises one or more spare regions, each of the one or more spare regions including a first multi-level cell and a second multi-level cell; and a control logic configured to control programming of first page data and at least one first dummy data in the first multi-level cell and configured to control programming of second page data and at least one second dummy data in the second multi-level cell, the first and second page data being data input into the non-volatile memory device.

According to some example embodiments, the non-volatile memory device of claim 23, further comprises a processor configured to control an operation of the non-volatile memory device.

According to some example embodiments, the non-volatile memory device of claim 23, further comprises a plurality of layers, each of the plurality of layers including a main region and a spare region from among the one or more spare regions, The non-volatile memory device is a three-dimensional non-volatile memory device, and the control logic is further configured to control programming of third page data and at least one third dummy in the third multi-level cell.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 7 is a state diagram showing a program state of a second multi-level cell of the spare region of the non-volatile memory device illustrated in FIG. 1;

DETAILED DESCRIPTION OF THE EMBODIMENTS

Figure 1:
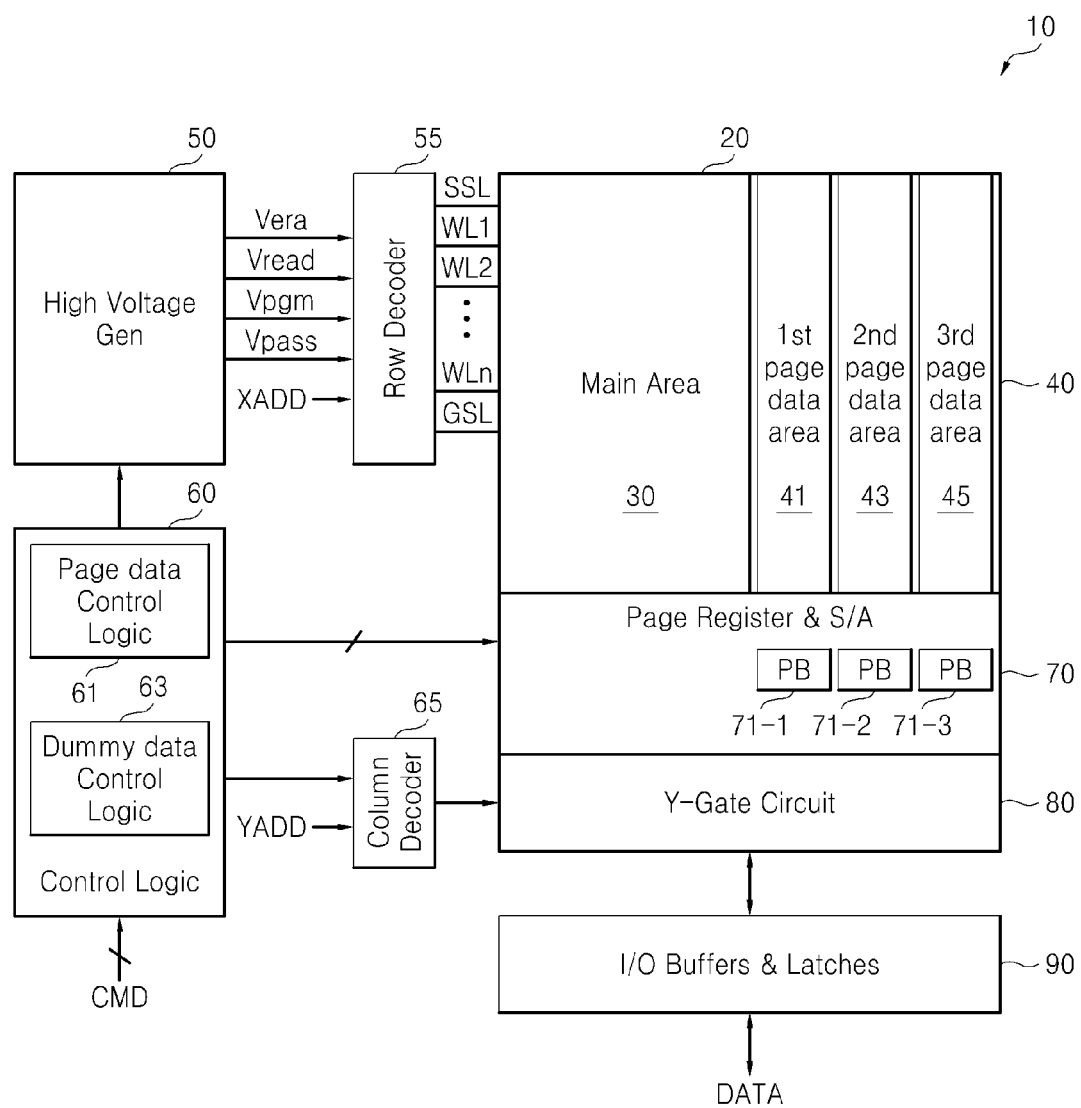
FIG. 1 is a block diagram of a non-volatile memory device according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
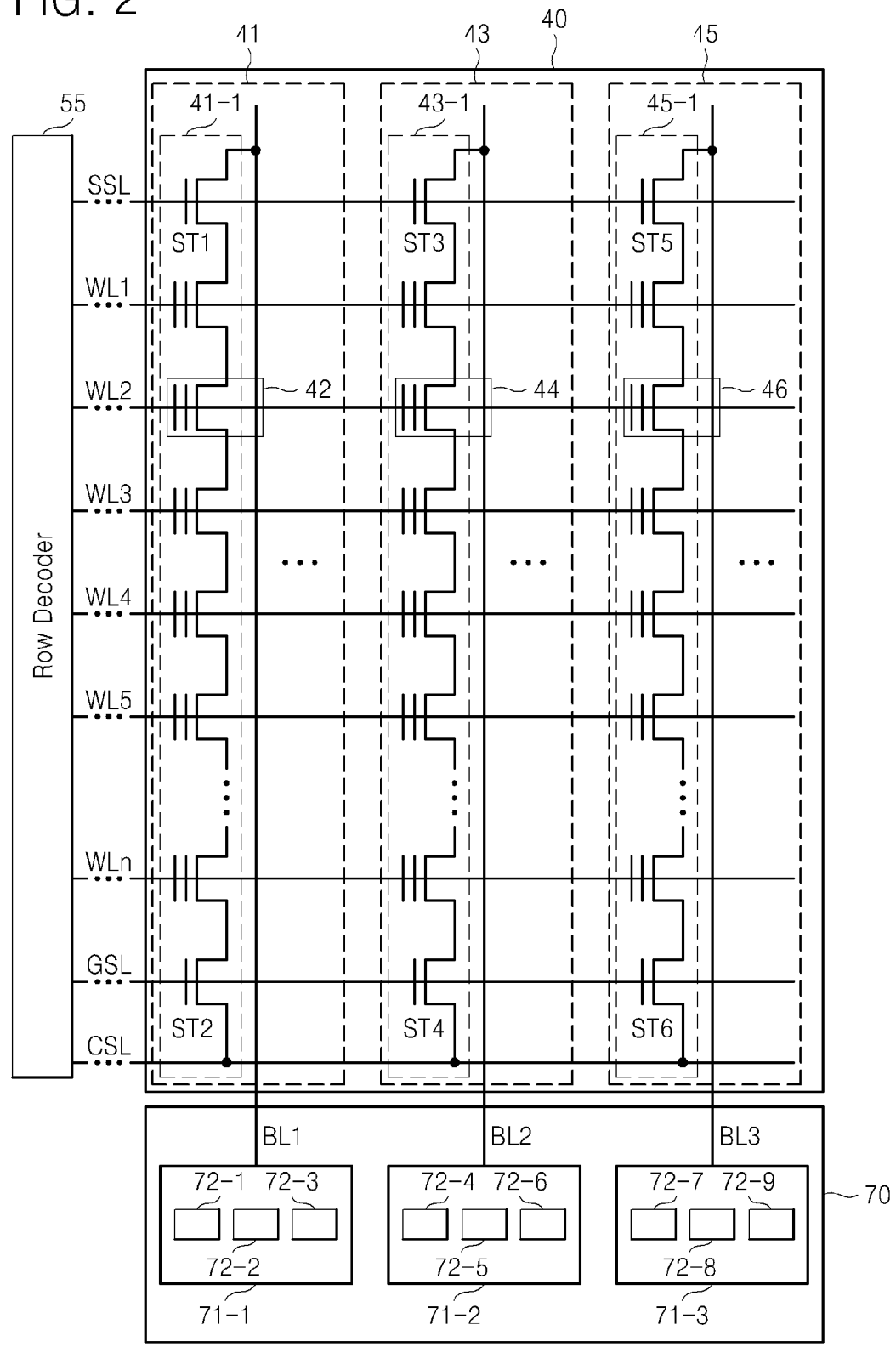
FIG. 2 is a detailed block diagram of a spare region, a row decoder, and a page register/sense amplifier block when a spare region of the non-volatile memory device illustrated in FIG. 1 is implemented two-dimensionally.

FIG. 1 is a block diagram of a non-volatile memory device 10 according to an example embodiment. FIG. 2 is a detailed block diagram of a two-dimensional spare region 40, a row decoder 55, and a page register/sense amplifier block 70 when the spare region 40 illustrated in FIG. 1 is implemented two-dimensionally. The two-dimensional implementation of the spare region 40 may denote two-dimensional implementation of a memory cell array 20 included in the non-volatile memory device 10 of FIG. 1.

Referring to FIGS. 1 and 2, the non-volatile memory device 10 includes the memory cell array 20, a high voltage generator 50, the row decoder 55, a control logic 60, a column decoder 65, the page register/sense amplifier block 70, a Y-gating circuit 130, and an input/output buffer & latch block 90.

The memory cell array 20 includes a main region 30 and the spare region 40.

The main region 30 stores data, for example, user data. The spare region 40 stores, for example, metadata for improving the integrity of the data stored in the main region 30, or data necessary for a firmware operation. The spare region 40 may include a first page data region 41 and a second page data region 43. In some embodiments, the spare region 40 may further include a third page data region 45. In another embodiment, the spare region 40 may further include at least one special page data region in addition to the third page data region 45.

The first page data region 41, the second page data region 43, and the third page data region 45 may be a space of the spare region 40. Although the first page data region 41, the second page data region 43, and the third page data region 45 each include a plurality of cell strings, FIG. 2 illustrates only one string cell for convenience of explanation.

As shown in FIG. 2, a first cell string 41-1, a second cell string 43-1, and a third cell string 45-1 denote one of the cell strings included in the first page data region 41, one of the cell strings included in the second page data region 43, and one of the cell strings included in the third page data region 45, respectively.

Figure 3:
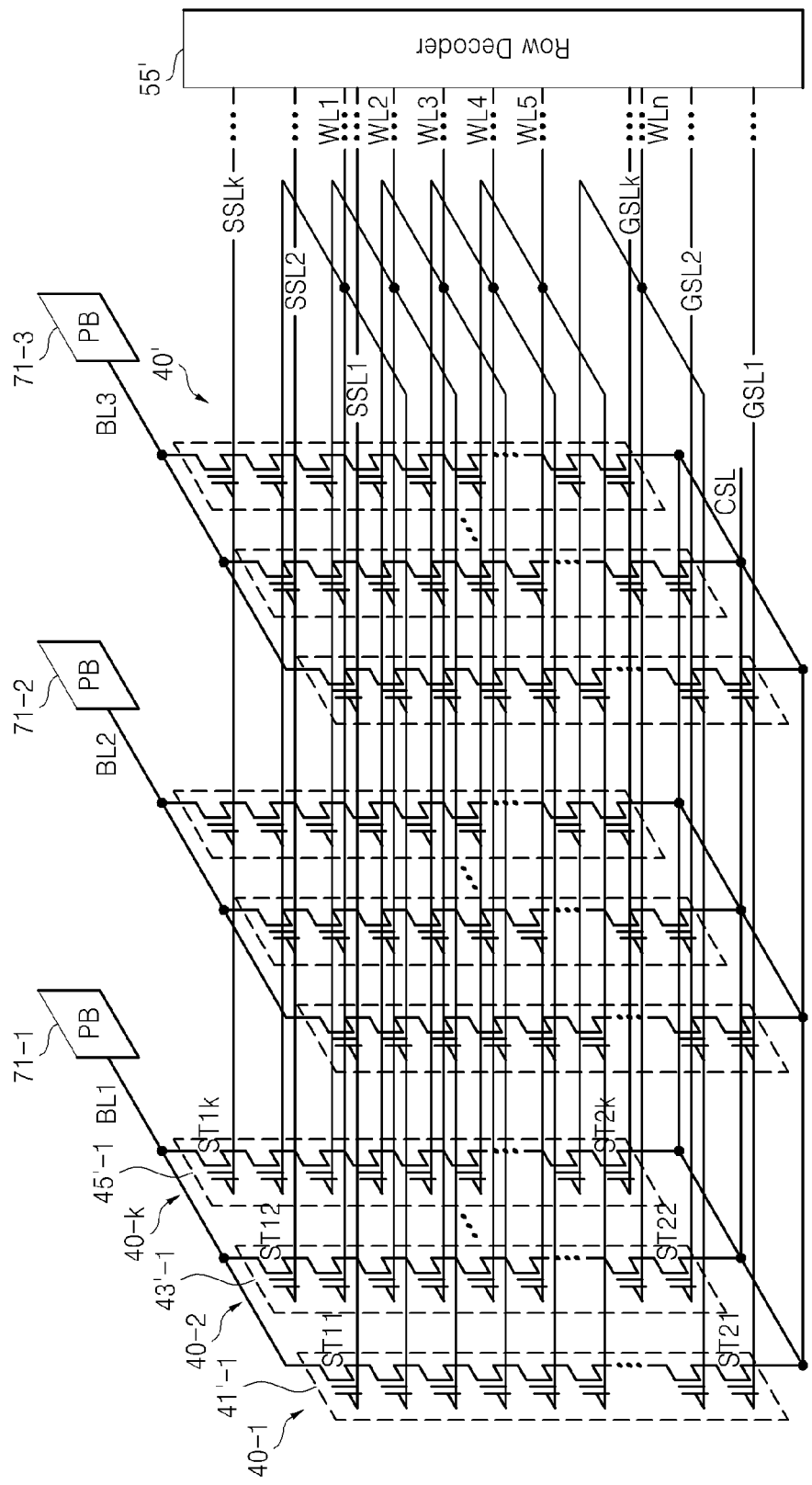
FIG. 3 is a detailed block diagram of a spare region, a row decoder, and a page register/sense amplifier block when the spare region of the non-volatile memory device illustrated in FIG. 1 is implemented three-dimensionally.

Each of the cell strings 41-1, 43-1, and 45-1 includes a plurality of non-volatile memory cells. As shown in FIG. 2, each of the cell strings 41-1, 43-1, and 45-1 may be two-dimensionally disposed (or implemented) on the same plane (or layer). As shown in FIG. 3, cell strings 41'-1, 43'-1, and 45'-1 may be each three-dimensionally disposed (or implemented) on different planes (or layers).

For example, the first cell string 41'-1 may be three-dimensionally disposed on a first layer 40-1, the second cell string 43'-1 may be three-dimensionally disposed on a second layer 40-2 different from the first layer 40-1, and the third cell string 45'-1 may be three-dimensionally disposed on a third layer 40-k (where k denotes a natural number, for example, 3) different from the second layer 40-2. In some embodiments, as shown in FIG. 2, cell stings corresponding to the cell strings 41-1, 43-1, and 45-1 may be disposed on one selected from the group consisting of the plurality of layers 40-1 through 40-k.

The first cell string 41-1 shown in FIG. 2 includes a plurality of non-volatile memory cells serially connected between a first selection transistor ST1 connected to a bit line BL1 and a second selection transistor ST2 connected to a ground (or a common source line CSL).

The second cell string 43-1 shown in FIG. 2 includes a plurality of non-volatile memory cells serially connected between a third selection transistor ST3 connected to a bit line BL2 and a fourth selection transistor ST4 connected to the ground (or the common source line CSL). The third cell string 45-1 shown in FIG. 2 includes a plurality of non-volatile memory cells serially connected between a fifth selection transistor ST5 connected to a bit line BL3 and a sixth selection transistor ST6 connected to the ground (or the common source line CSL).

Each of the non-volatile memory cells included in each of the cell strings 41-1, 43-1, and 45-1 may be implemented into Electrically Erasable Programmable Read-Only Memory (EEPROM) capable of storing one or more bits. In some embodiments, each of the non-volatile memory cells may be implemented into NAND flash memory capable of storing one or more bits, for example, a single level cell (SLC) or a multi-level cell (MLC). Accordingly, each of the cell strings 41-1, 43-1, and 45-1 may be referred to as a NAND string.

A first MLC 42, a second MLC 44, and a third MLC 46 are examples of a non-volatile memory cells included in the first cell string 41-1, a non-volatile memory cell included in the second cell string 43-1, and a non-volatile memory cell included in the third cell string 45-1, respectively.

FIG. 3 is a detailed block diagram of a three-dimensional spare region 40, a row decoder 55', and page buffers 71-1, 71-2, and 71-3 when the spare region 40 of FIG. 1 is implemented three-dimensionally. The three-dimensional implementation of the spare region 40 denotes three-dimensional implementation of the memory cell array 20 of FIG. 1 as shown in FIG. 3.

As shown in FIG. 3, each of the layers 40-1, 40-2, ..., and 40-k (where k denotes a natural number) includes a plurality of cell strings. For example, the layers 40-1 through 40-k may be implemented into a wafer shaped stack, a chip shaped stack, or a cell shaped stack. Electrical connection between layers may use a through silicon via (TSV), wire bonding, or bumps.

For example, the first cell string 41'-1 implemented on the first layer 40-1 includes a plurality of non-volatile memory cells, for example, NAND flash memory cells, serially connected between a plurality of selection transistors, namely, first and second selection transistors ST11 and ST21. For example, the second cell string 43'-1 implemented on the second layer 40-2 includes a plurality of non-volatile memory cells, for example, NAND flash memory cells, serially connected between a plurality of selection transistors, namely, first and second selection transistors ST12 and ST22. For example, the third cell string 45'-1 implemented on the third layer 40-k (where k is 3) includes a plurality of non-volatile memory cells, for example, NAND flash memory cells, serially connected between a plurality of selection transistors, namely, first and second selection transistors ST1k and ST2k.

The row decoder 55' shown in FIG. 3 may provide string selection lines SSL1, SSL2, ..., and SSLk connected to respective gates of the first selection transistors ST11, ST12, ..., and ST1k respectively implemented on the layers 40-1, 40-2, ..., and 40-k with selection signals (for example, a read voltage Vread during a read operation, a power supply voltage during a program operation, or 0V during an erase operation). Accordingly, each of the first selection transistors ST11, ST12, ..., and ST1k may be selectively turned on or turned off. The row decoder 55' may also provide ground selection lines GSL1, GSL2, ..., and GSLk connected to respective gates of the second selection transistors ST21, ST22, ..., and ST2k respectively implemented on the layers 40-1, 40-2, ..., and 40-k with selection signals (for example, a read voltage Vread during a read operation or 0V during a program operation and an erase operation). Accordingly, each of the second selection transistors ST21, ST22, ..., and ST2k may be selectively turned on or turned off. In other words, the cell strings 41'-1, 43'-1, and 45'-1 implemented on the layer 40-1, 40-2, ..., and 40-k, respectively, may be selected by the row decoder 55'.

As shown in FIG. 3, each of the cell strings 41'-1, 43'-1, and 45'-1 may share a plurality of word lines WL1 through WLn, the common source line CSL, and the bit line BL1. In other words, cell strings implemented at locations corresponding to the layers 40-1 through 40-k may be connected to the page buffers 71-1, 71-2, and 71-3 implemented in the page register/sense amplifier block 70.

An operation of the non-volatile memory device 10 on the assumption that the first MLC 42 is selected from the plurality of non-volatile memory cells included in the first page data region 41 of the two dimensional spare region 40, the second MLC 44 is selected from the plurality of non-volatile memory cells included in the second page data region 43 of the spare region 40, and the third MLC 46 is selected from the plurality of non-volatile memory cells included in the third page data region 45 of the spare region 40 will now be described.

Accordingly, the spare region 40 used in the present specification denotes both the two-dimensional spare region 40 shown in FIG. 2 and the three-dimensional spare region 40' shown in FIG. 3, and the row decoder 55 used in the present specification denotes both the row decoder 55 shown in FIG. 2 and the row decoder 55' shown in FIG. 3. The control logic 60 denotes hardware capable of performing a program method according to an example embodiment or software-embedded hardware capable of performing the program method.

The control logic 60 may control an operation of the page register/sense amplifier block 70 so that both first page data and at least one first dummy data are programmed in the first MLC 42 and both second page data and at least one second dummy data are programmed in the second MLC 44.

In some embodiments, when the spare region 40 further includes the third MLC 46, the control logic 60 may control an operation of the page register/sense amplifier block 70 so that both third page data and at least one third dummy data are programmed in the third MLC 46.

Each of the first page data, the second page data, and the third page data originally denotes data capable of being stored in a single MLC, for example, each bit included in metadata. For example, when the metadata is 3-bit data, a most significant bit (MSB) may be used as the first page data, a center significant bit (CSB) may be used as the second page data, and a least significant bit (LSB) may be used as the third page data.

The first page data, the second page data, and the third page data are programmed together with the first dummy data, the second dummy data, and the third dummy data in the first MLC 42, the second MLC 44, and the third MLC 46, respectively, whereby the threshold voltages of the first, second, and third MLCs 42, 44, and 46 increase. Accordingly, the integrity of the data stored in each of the first, second, and third MLCs 42, 44, and 46 of a read operation is improved.

The control logic 60 capable of controlling the operation of the page register/sense amplifier block 70 includes a page data control logic 61 and a dummy data control logic 63. Here, the logic may denote hardware or software-embedded hardware.

Figure 4:
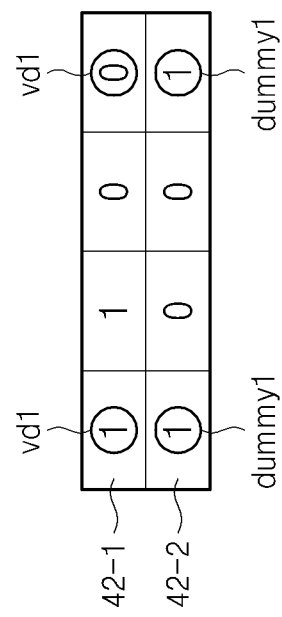
FIG. 4 is a state diagram showing a program state of a first multi-level cell of the spare region of the non-volatile memory device illustrated in FIG. 1.
Figure 5:
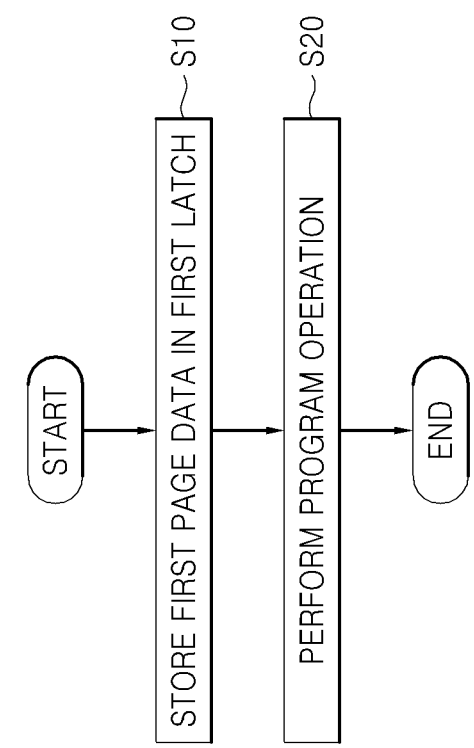
FIG. 5 is a flowchart of a first program operation of the first multi-level cell.
Figure 6:
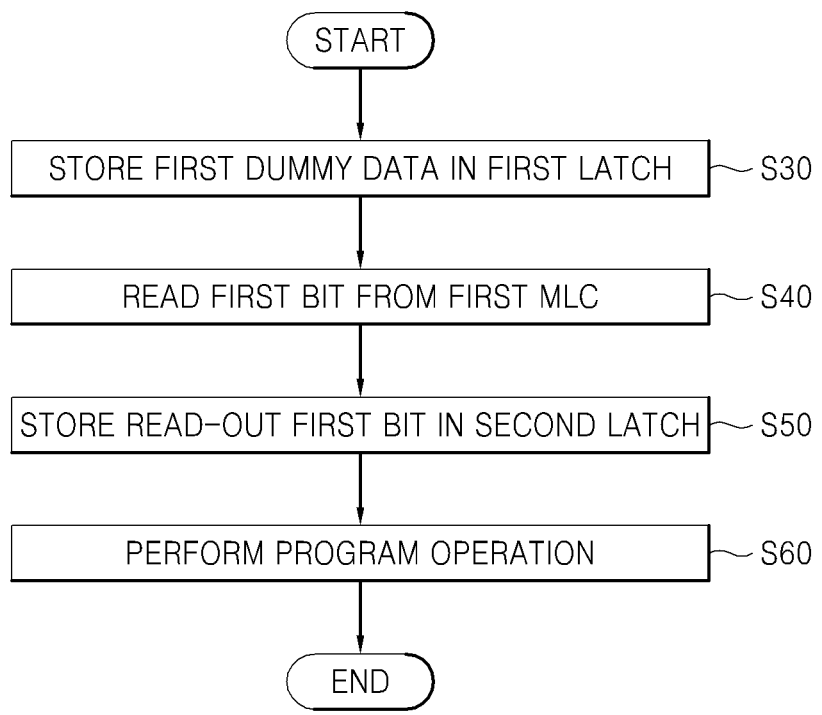
FIG. 6 is a flowchart of a second program operation of the first multi-level cell.

FIG. 4 is a state diagram showing a program state of the first MLC 42, FIG. 5 is a flowchart of a first program operation of the first MLC 42, and FIG. 6 is a flowchart of a second program operation of the first MLC 42. Referring to FIGS. 1 through 6, the page data control logic 61 controls first page data vd1, for example, data '1' or data '0', to be stored in a first latch 72-1 connected to the first MLC 42, in operation S10.

According to a program command, the page data control logic 61 controls the first page data vd1 stored in the first latch 72-1 to be programmed as a first bit 42-1 in the first MLC 42, in operation S20. The first bit 42-1 may be the MSB of the first MLC 42.

The first program operation of the first MLC 42 includes the operations S10 and S20. The dummy data control logic 63 controls first dummy data dummy1, for example, data '1', to be stored in the first latch 72-1 connected to the first MLC 42, in operation S30.

The page data control logic 61 reads the first bit 42-1 programmed in the first MLC 42 in operation S40, and controls the read-out first bit 42-1 to be stored in a second latch 72-2 connected to the first multi-level cell 42, in operation S50. The second latch 72-2 may be the LSB latch of the first MLC 42.

The dummy data control logic 63 controls the first dummy data dummy1 together with the first bit 42-1 to be programmed as a second bit 42-2 in the first MLC 42, in operation S60. For example, when the first bit 42-1 is data '0', the dummy data control logic 63 increases the threshold voltage of the first MLC 42 to control data '01' to be programmed in the first MLC 42.

When the first MLC 42 stores 2 bits in each cell, the second bit 42-2 may be the LSB of the first MLC 42. The second program operation of the first MLC 42 includes the operations S30 through S60. In some embodiments, when the first MLC 42 stores 2 bits in each cell, the first bit 42-1 and the second bit 42-2 may be the LSB and MSB of the first MLC 42, respectively.

Figure 7:
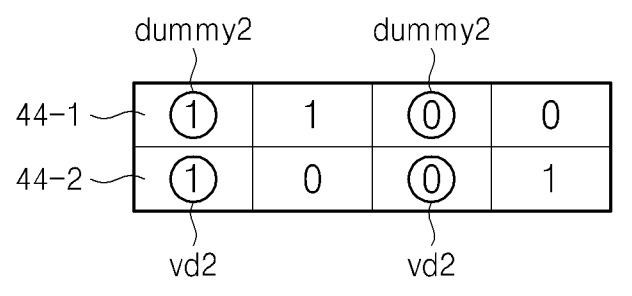
Figure 8:
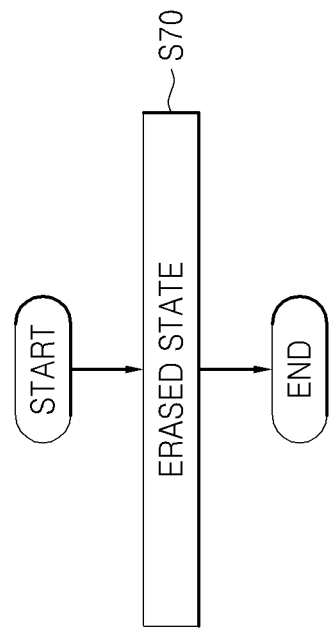
FIG. 8 is a flowchart of an operation of the second multi-level cell during the first program operation of the first multi-level cell.
Figure 9:
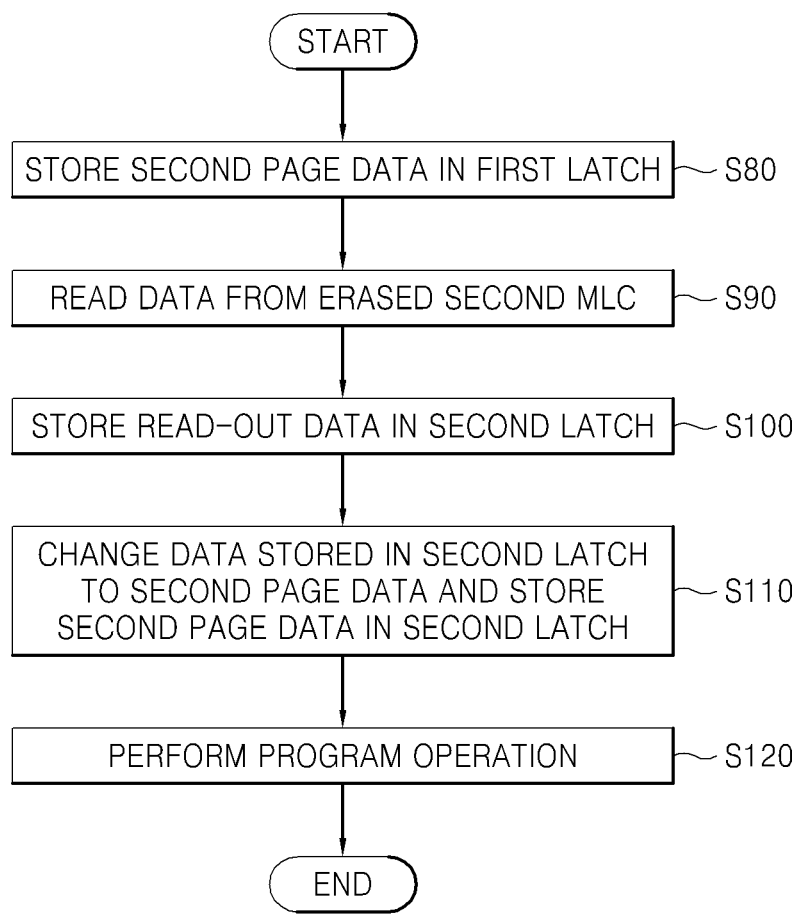
FIG. 9 is a flowchart of a second program operation of the second multi-level cell.

FIG. 7 is a state diagram showing a program state of the second MLC 44, FIG. 8 is a flowchart of an operation of the second MLC 44 during the first program operation of the first MLC 42, and FIG. 9 is a flowchart of a second program operation of the second multi-level cell 44. Referring to FIGS. 1, 2, and 4 through 8, during the first program operation of the first MLC 42, the second MLC 44 is in an erase state, in operation S70.

During the second program operation of the first MLC 42, the page data control logic 61 controls second page data vd2, for example, data '1' or data '0', to be stored in a first latch 72-4 connected to the second MLC 44, in operation S80.

The dummy data control logic 63 controls the data of the erased second multi-level cell 44 to be read, in operation S90. Here, the read-out data is data '1'. The dummy data control logic 63 controls the read-out data to be stored in a second latch 72-5 connected to the second multi-level cell 44, in operation S100. The second bit 72-5 may be a LSB latch of the second multi-level cell 44. The dummy data control logic 63 controls the data stored in the second latch 72-5 to be changed to the second page data vd2 and the second page data vd2 to be stored as the second dummy data dummy2 in the second latch 72-5, in operation S110. For example, when the second page data vd2 is data '0', the dummy data control logic 63 controls the data '1' stored in the second latch 72-5 to be changed to the data '0' and the data '0' to be stored as the second dummy data dummy2 in the second latch 72-5.

In some embodiments, the dummy data control logic 63 may allow the data stored in the second latch 72-5 to be changed to inverted second page data and the inverted second page data to be stored as the second dummy data dummy2 in the second latch 72-5. For example, when the second page data vd2 is data '1', inverted second page data is '0', and the data dummy data control logic 63 may allow the data '1' stored in the second latch 72-5 to be changed to the data '0' and the data '0' to be stored as the second dummy data dummy2 in the second latch 72-5.

The page data control logic 61 controls the second page data vd2 together with the second dummy data dummy2 to be stored as a fourth bit 44-2 and a fifth bit 44-1 in the second MLC 44, in operation S120. For example, when the second page data vd2 is data '0', the dummy data control logic 61 increases the threshold voltage of the second MLC 44 to control data '00' to be programmed in the second MLC 44.

When the second MLC 44 stores 2 bits in each cell, the fourth bit 44-2 is the LSB of the second MLC 44, and the fifth bit 44-1 is the MSB of the second MLC 44.

In another embodiment, the fourth bit 44-2 may be the MSB of the second MLC 44, and the fifth bit 44-1 may be the LSB of the second MLC 44. The second program operation of the first MLC 42 and the second program operation of the second MLC 44 can be performed simultaneously.

The second program operation of the second MLC 44 includes the operations S80 through S120.

Figure 10:
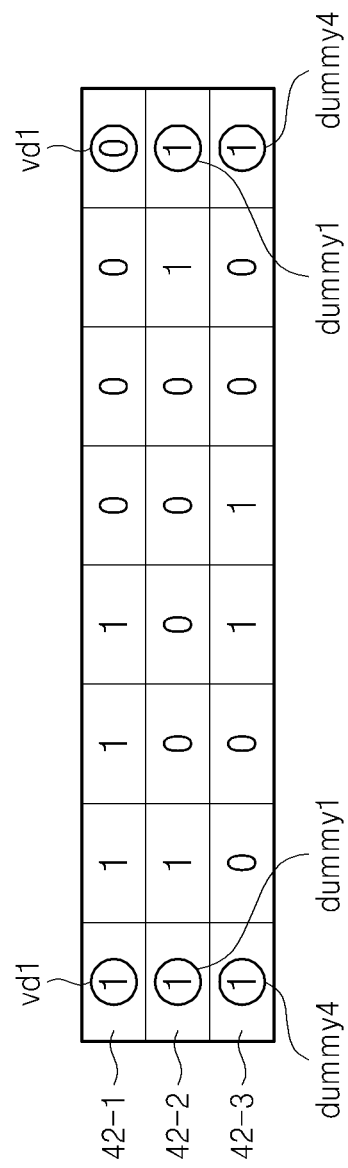
FIG. 10 is a state diagram showing a program state of the first multi-level cell when the spare region of FIG. 1 further includes a third multi-level cell.
Figure 11:
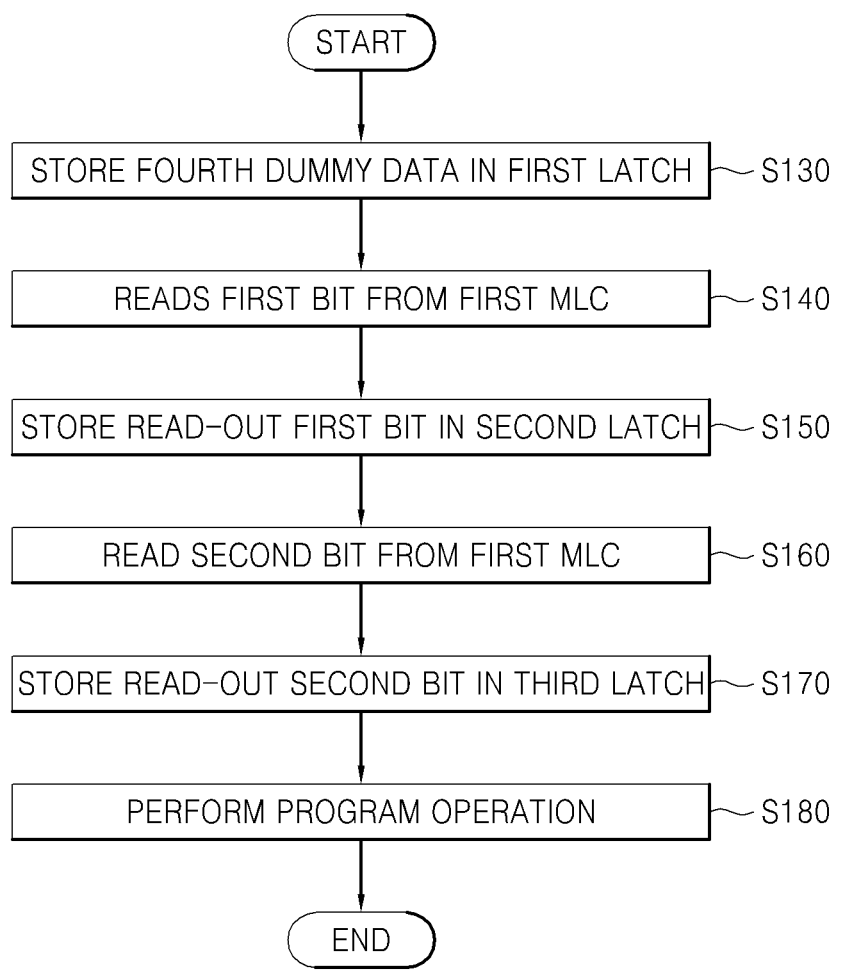
FIG. 11 is a flowchart of a third program operation of the first multi-level cell.

FIG. 10 is a state diagram showing a program state of the first MLC 42 when the spare region 40 of FIG. 1 further includes the third MLC 46. FIG. 11 is a flowchart of a third program operation of the first MLC 42. Referring to FIGS. 1, 2, 4, 5, 6, 10, and 11, the dummy data control logic 63 controls fourth dummy data dummy4, for example, data '1', to be stored in the first latch 72-1 connected to the first MLC 42, in operation S130.

The page data control logic 61 reads the first bit 42-1 programmed in the first MLC 42 in operation S140, and controls the read-out first bit 42-1 to be stored in the second latch 72-2 connected to the first MLC 42, in operation S150.

The dummy data control logic 63 reads the second bit 42-2 programmed in the first MLC 42 in operation S160, and controls the read-out second bit 42-2 to be stored in a third latch 72-3 connected to the first MLC 42, in operation S170. The third latch 72-3 may be the MSB latch of the first MLC 42. The dummy data control logic 63 controls fourth dummy data dummy4 together with the first and second bits 42-1 and 42-2 to be programmed as a third bit 42-3 in the first MLC 42, in operation S180. For example, when the first and second bits 42-1 and 42-2 are data '0' and data '1', respectively, the dummy data control logic 63 increases the threshold voltage of the first MLC 42 to control data '011' to be programmed in the first MLC 42.

When the fourth dummy data dummy4 is stored as the third bit 42-3 in the first MLC 42, the first bit 42-1 is the MSB of the first MLC 42, the second bit 42-2 is the CSB of the first MLC 42, and the third bit 42-3 is the LSB of the first MLC 42. In some embodiments, the order of the first, second, and third bits 42-1, 42-2, and 42-3 may be changed.

The third program operation of the first MLC 42 includes the operations S130 through S180.

Figure 12:
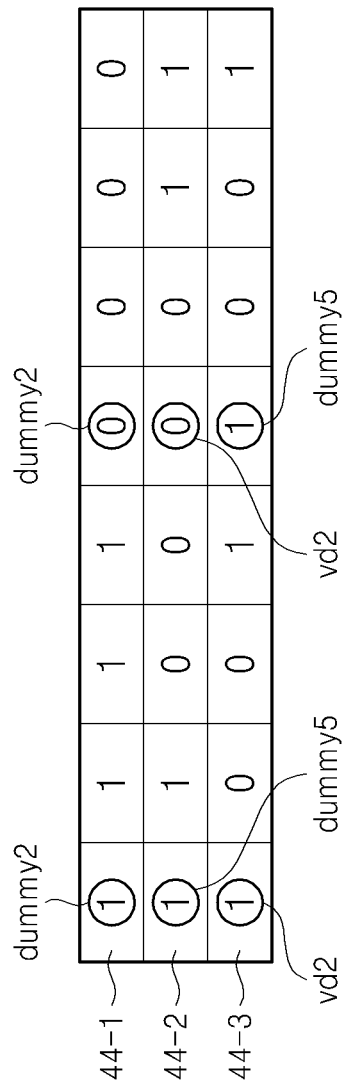
FIG. 12 is a state diagram showing a program state of the second multi-level cell when the spare region of FIG. 1 further includes the third multi-level cell.
Figure 13:
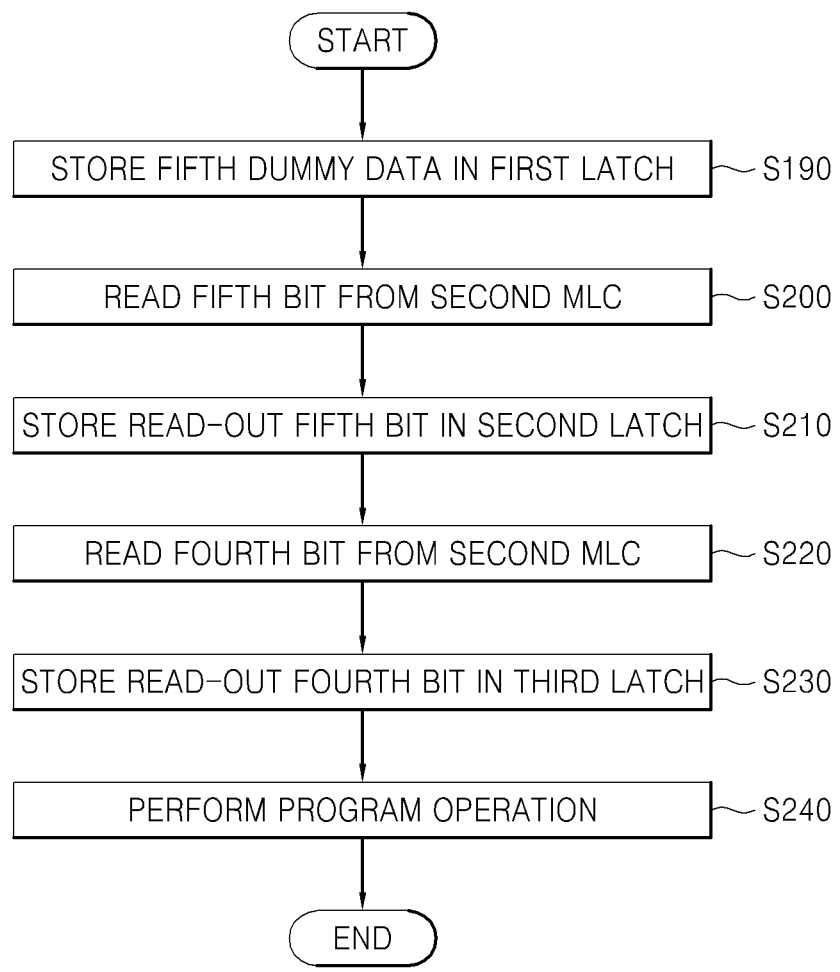
FIG. 13 is a flowchart of a third program operation of the second multi-level cell.

FIG. 12 is a state diagram showing a program state of the second MLC 44 when the spare region 40 of FIG. 1 further includes the third multi-level cell 46. FIG. 13 is a flowchart of a third program operation of the second multi-level cell 44. Referring to FIGS. 1, 2, 4, 8, 9, 12, and 13, the dummy data control logic 63 controls fifth dummy data dummy5, for example, data '1', to be stored in the first latch 72-4 connected to the second MLC 44, in operation S190.

The dummy data control logic 63 reads a fifth bit 44-1 programmed in the second MLC 44 in operation S200, and controls the read-out fifth bit 44-1 to be stored in the second latch 72-5 connected to the second MLC 44, in operation S210. For example, the fifth bit 44-1 programmed in the second MLC 44 is data '1' or data '0', which is the second dummy data dummy2.

The dummy data control logic 63 reads a fourth bit 44-2 programmed in the second MLC 44 in operation S220, and controls the read-out fourth bit 44-2 to be stored in a third latch 72-6 connected to the second MLC 44, in operation S230. The third latch 72-6 may be an MSB latch of the second MLC 44. For example, the fourth bit 44-2 programmed in the second MLC 44 is data '1' or data '0', which is second effective data vd2.

The dummy data control logic 63 controls the fifth dummy data dummy5 together with the fifth and fourth bits 44-1 and 44-2 to be programmed as a sixth bit 44-3 in the second MLC 44, in operation S240. For example, when the fifth and fourth bits 44-1 and 44-2 are data '0' and data '0', respectively, the dummy data control logic 63 increases the threshold voltage of the second MLC 44 to control data '001' to be programmed in the second MLC 44.

The third program operation of the second MLC 44 includes the operations S190 through S240.

In this case, the fifth bit 44-1 is the MSB of the second MLC 44, the fourth bit 44-2 is the CSB of the second MLC 44, and the sixth bit 44-3 is the LSB of the second MLC 44. In some embodiments, the order of the fifth, fourth, and sixth bits 44-1, 44-2, and 44-3 may be changed.

Figure 14:
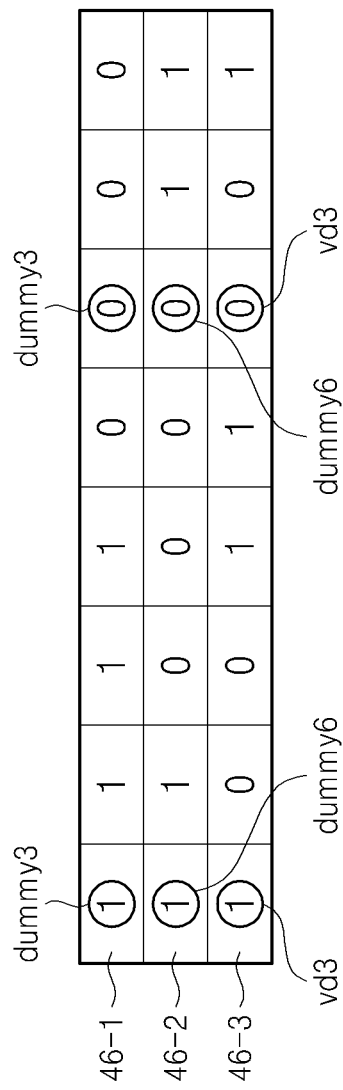
FIG. 14 is a state diagram showing a program state of the third multi-level cell.
Figure 15:
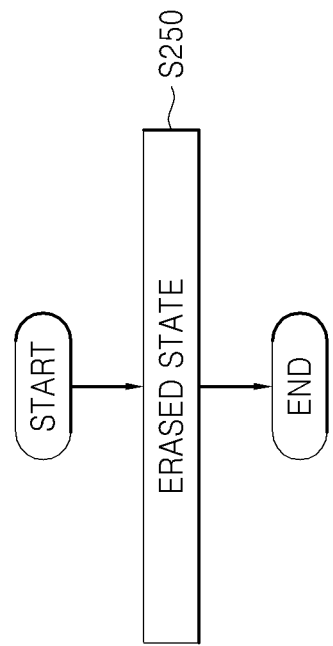
FIG. 15 is a flowchart of an operation of the third multi-level cell during the first and second program operations of the first multi-level cell.
Figure 16:
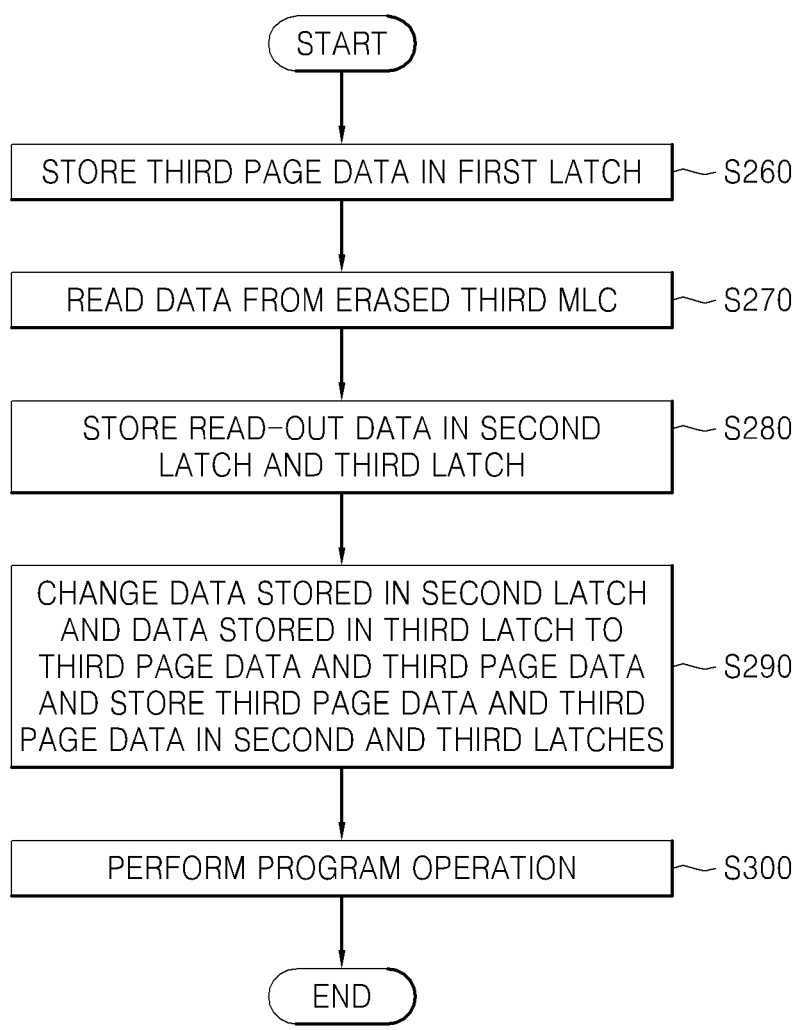
FIG. 16 is a flowchart of a third program operation of the third multi-level cell.

FIG. 14 is a state diagram showing a program state of the third MLC 46. FIG. 15 is a flowchart of an operation of the third MLC 46 during the first and second program operations of the first MLC 42. FIG. 16 is a flowchart of a third program operation of the third MLC 46. Referring to FIGS. 1, 2, 4, and 14 through 16, during the first and second program operations of the first MLC 42, the third MLC 46 is in an erase state, in operation S250.

During the third program operation of the first MLC 42, the page data control logic 61 controls third page data vd3, for example, data '1' or data '0', to be stored in a first latch 72-7 connected to the third MLC 46, in operation S260. The dummy data control logic 63 controls at least two bits of the data of the erased third MLC 46 to be read, in operation S270. Here, the read-out data is, for example, data '11'. The dummy data control logic 63 controls the read-out data to be stored in a second latch 72-8 and a third latch 72-9 connected to the third MLC 46, in operation S280.

The second latch 72-8 may be an LSB latch of the third MLC 46, and the third latch 72-9 may be an MSB latch of the third MLC 46.

The dummy data control logic 63 controls the data stored in the second latch 72-8 and the data stored in the third latch 72-9 to be changed to the third page data vd3 and the third page data vd3 to be stored as the third and sixth dummy data dummy3 and dummy6, respectively, in the second and third latches 72-8 and 72-9, respectively, in operation S290. For example, when the third page data vd3 is data '0', the dummy data control logic 63 controls the data '1' stored in the second and third latches 72-8 and 72-9 to be changed to the data '0' and the data '0' to be stored as the third and sixth dummy data dummy3 and dummy6 in the second and third latches 72-8 and 72-9, respectively.

In some embodiments, the dummy data control logic 63 may control the data stored in the second and third latches 72-8 and 72-9 to be changed to inverted third page data and the inverted third page data to be stored as the third and sixth dummy data dummy3 and dummy6 in the second and third latches 72-8 and 72-9, respectively.

For example, when the third page data vd3 is data '1', since inverted third page data vd3 is data '0', the dummy data control logic 63 controls the data '1' stored in the second latch 72-8 and the data '1' stored in the third latch 72-9 to be changed to the data '0' and the data '0' and controls the data '0' and the data '0' to be stored as the third and sixth dummy data dummy3 and dummy6, respectively, in the second and third latches 72-8 and 72-9, respectively.

The page data control logic 61 controls the third page data vd3 together with the third and sixth dummy data dummy3 and dummy6 to be programmed as a seventh bit 46-1, an eighth bit 46-2, and a ninth bit 46-3 of the third MLC 46, respectively, in operation 5300.

For example, when the third page data vd3 is data '0', the dummy data control logic 61 increases the threshold voltage of the third MLC 46 to control data '000' to be programmed in the third MLC 46.

The seventh bit 46-1 is the MSB of the third MLC 46, the eighth bit 46-2 is the CSB of the third MLC 46, and the ninth bit 46-3 is the LSB of the third MLC 46. In some embodiments, the order of the seventh, eighth, and ninth bits 46-1, 46-2, and 46-3 may be changed.

The third program operation of the third MLC 46 includes the operations S260 through S300.

The respective third program operations of the first, second, and third MLCs 42, 44, and 46 are performed simultaneously.

Accordingly, the first page data vd1, the second page data vd2, and the third page data vd3 are sequentially programmed in the first MLC 42, the second MLC 44, and the third MLC 46, together with at least one dummy bit corresponding to each of the first, second, and third page data vd1, vd2, and vd3. Therefore, the non-volatile memory device 10 may also read a plurality of pieces of page data stored in the spare region 40 while reading data from the main region 30, without performing an additional read operation.

Referring to FIG. 14, the control logic 60 may increase a read margin by controlling the third page data vd3 together with the third and sixth dummy data dummy3 and dummy6 to be programmed in the third MLC 46. Referring back to FIG. 1, under the control of the control logic 60, the high voltage generator 50 generates a plurality of voltages including a program voltage Vpgm and a pass voltage Vpass necessary for performing a program operation, a plurality of voltages including a read voltage Vread necessary for performing a read operation, or a plurality of voltages including an erase voltage Vera necessary for performing an erase operation, and outputs the voltages required to perform each operation to the row decoder 55.

During a program operation of the first MLC 42, the row decoder 55, in response to row addresses XADD, supplies the program voltage Vpgm output from the high voltage generator 50 to a word line WL2 from among the word lines WL1 through WLn, the pass voltage Vpass output from the high voltage generator 50 to the remaining word lines WL1 and WL3 through WLn, and a power supply voltage Vcc to a string selection line SSL connected to the gate of the first selection transistor ST1. At this time, a ground voltage is supplied to a ground selection line GSL connected to the gate of the second selection transistor ST2, the common source line CSL, and the bulk of each of the plurality of non-volatile memory cells. The second and third MLCs 44 and 46 are programmed in the same manner as the manner in which the first MLC 42 is programmed.

The control logic 60 may control an operation of the page register/sense amplifier block 70 and an operation of the input/output buffer & latch block 90 according to an externally input command CMD, for example, a program command, a read command, or an erase command.

The page register/sense amplifier block 70 of FIG. 2 includes the plurality of page buffers 71-1, 71-2, and 71-3. Each of the page buffers 71-1, 71-2, and 71-3 operates as a driver for programming data into the spare region 40 during a program operation under the control of the control logic 60.

Each of the page buffers 71-1, 71-2, and 71-3 may operate as a sense amplifier capable of sensing the threshold voltage of one selected from the non-volatile memory cells implemented on the spare region 40 during a read operation or a verify operation under the control of the control logic 60. The page buffers 71-1, 71-2, and 71-3 include the plurality of latches 72-1 through 72-9 for storing the data stored or to be stored in the first, second, and third MLCs 42, 44, and 46. The data indicates a plurality of pieces of page data or a plurality of pieces of dummy data.

The column decoder 65 decodes column addresses YADD and outputs a result of the decoding, namely, decoding signals, to the Y-gating circuit 80 under the control of the control logic 60.

The Y-gating circuit 80 may control transmission of data DATA between the page register/sense amplifier block 70 and the input/output buffer & latch block 90 in response to the decoding signals output from the column decoder 55. The input/output buffer & latch block 90 may transmit the data DATA to the Y-gating circuit 80 or transmit the data DATA to the outside via data pins. The threshold voltage of a non-volatile memory cell may be controlled by adjusting the level of a voltage supplied to the word line of the non-volatile memory cell.

Figure 17:
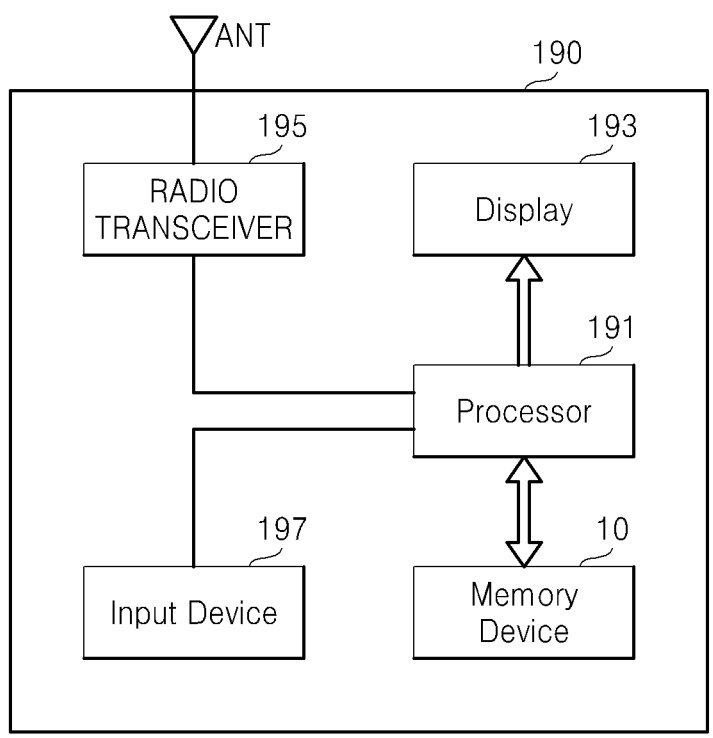
FIG. 17 is a block diagram showing an electronic device including the non-volatile memory device illustrated in FIG. 1, according to an example embodiment.

FIG. 17 is a block diagram showing an embodiment of an electronic device 190 including the non-volatile memory device 10 illustrated in FIG. 1. Referring to FIG. 17, the electronic device 190 capable of being implemented into a cellular phone, a smart phone, or a wireless Internet device includes the non-volatile memory device 10 and a processor 19 capable of controlling a data processing operation of the non-volatile memory device 10. The data stored in the non-volatile memory device 10 may be displayed on a display 193 under the control of the processor 191.

A radio transceiver 195 may transmit or receive radio signals via an antenna ANT. For example, the radio transceiver 195 may change the radio signals received via the antenna ANT to signals that can be processed by the processor 191. Accordingly, the processor 191 may process the signals output from the radio transceiver 195 and store the processed signals in non-volatile memory device 10 or display the processed signals on the display 193. The radio transceiver 195 may also change the signals output from the processor 191 to radio signals and output the radio signals via the antenna ANT.

An input device 197 is capable of inputting control signals for controlling an operation of the processor 191 or data which is to be processed by the processor 191, and may be implemented into a keypad, a keyboard, or a pointing device such as a touch pad or a computer mouse.

The processor 191 may control an operation of the display 193 so that data output from the non-volatile memory device 10, data output from the radio transceiver 195, or data output from the input device 197 may be displayed on the display 193.

Figure 18:
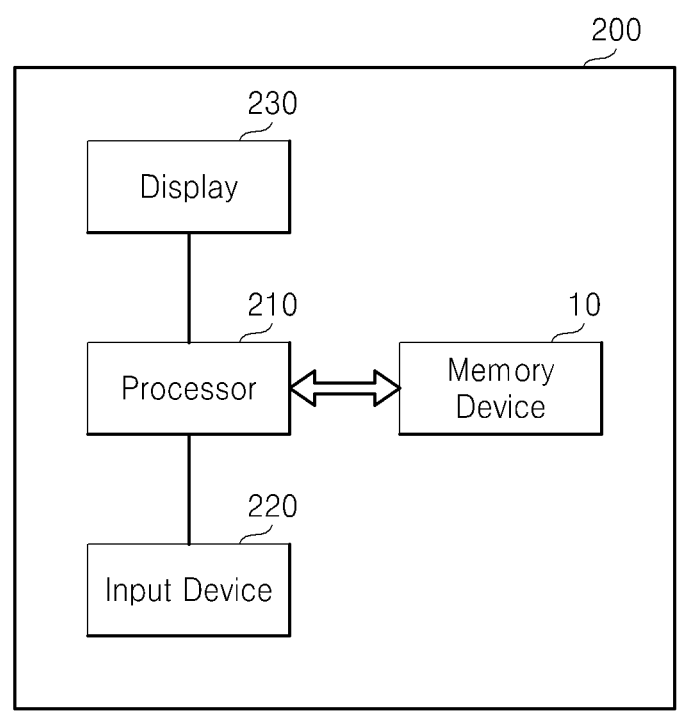
FIG. 18 is a block diagram showing an electronic device including the non-volatile memory device illustrated in FIG. 1, according to another example embodiment.

FIG. 18 is a block diagram showing an electronic device 200 including the non-volatile memory device 10 illustrated in FIG. 1, according to another example embodiment. Referring to FIG. 18, the electronic device 200 is capable of being implemented into a data processing device such as a tablet computer, a net-book, an e-reader, a personal digital assistant (PDA), a portable multimedia player (PMP), an MP3 player, or an MP4 player and includes the non-volatile memory device 10 and a processor 210 capable of controlling a data processing operation of the non-volatile memory device 10.

The processor 210 may display the data stored in the non-volatile memory device 10 on a display 230 according to an input signal generated by an input device 220. For example, the input device 220 may be implemented into a keypad, a keyboard, or a pointing device such as a touch pad or a computer mouse.

Figure 19:
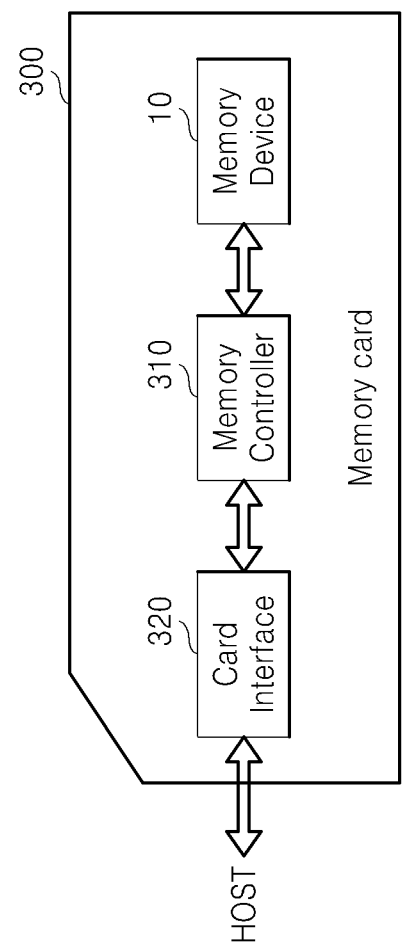
FIG. 19 is a block diagram showing an electronic device including the non-volatile memory device illustrated in FIG. 1, according to another example embodiment.

FIG. 19 is a block diagram showing an electronic device 300 including the non-volatile memory device 10 illustrated in FIG. 1, according to another example embodiment. Referring to FIG. 19, the electronic device 300 capable of being implemented into a memory card or a smart card includes the non-volatile memory device 10, a memory controller 310, and a card interface 320.

The memory controller 310 may control data exchange between the non-volatile memory device 10 and the card interface 320.

In some embodiments, the card interface 320 may be a secure digital (SD) card interface or a multi-media card (MMC) interface, but the present invention is not limited thereto. The card interface 320 may interface data exchange between a host and the memory controller 310, according to the protocol of the host.

When the electronic device 300 is connected to a host such as a computer, a digital camera, a digital audio player, a mobile phone, consol video game hardware, or a digital set-top box, the host may transmit or receive the data stored in the non-volatile memory device 10 via the card interface 320 and the memory controller 310.

Figure 20:
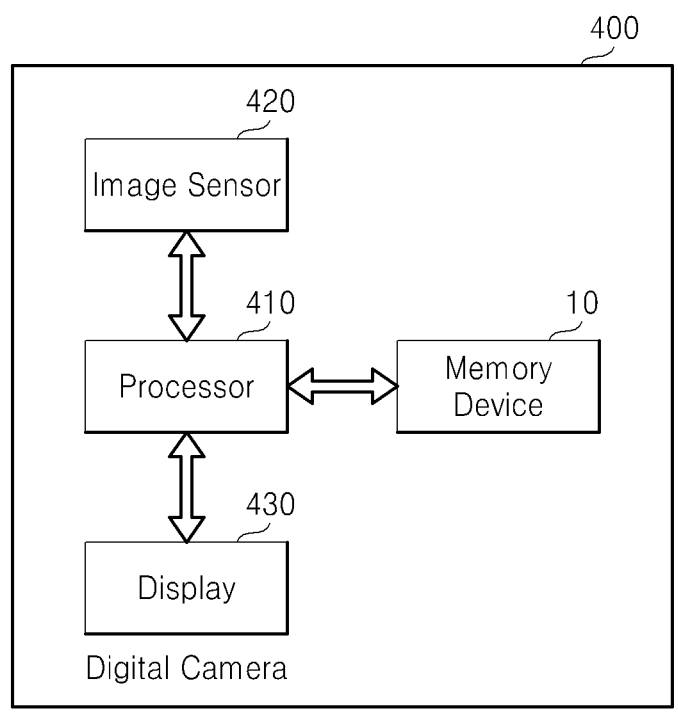
FIG. 20 is a block diagram showing an electronic device including the non-volatile memory device illustrated in FIG. 1, according to another example embodiment.

FIG. 20 is a block diagram showing an electronic device 400 including the non-volatile memory device 10 illustrated in FIG. 1, according to another example embodiment. Referring to FIG. 20, the electronic device 400 is capable of being implemented into a digital camera or a mobile phone to which a digital camera is attached, and includes the non-volatile memory device 10 and a processor 410 capable of controlling a data processing operation of the non-volatile memory device 10.

An image sensor 420 of the electronic device 400 converts an optical image into digital signals, and the digital signals are stored in the non-volatile memory device 10 or displayed on a display 430 under the control of the processor 410. The digital signals stored in the non-volatile memory device 10 may be displayed on the display 430 under the control of the processor 410.

Figure 21:
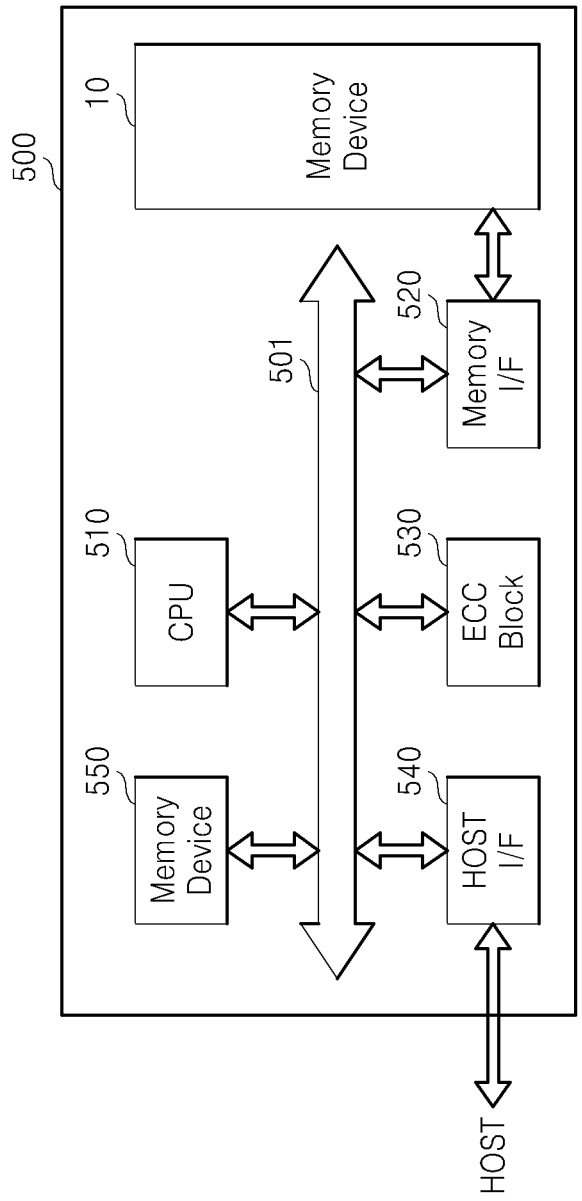
FIG. 21 is a block diagram showing an electronic device including the non-volatile memory device illustrated in FIG. 1, according to another example embodiment.

FIG. 21 is a block diagram showing an electronic device 500 including the non-volatile memory device 10 illustrated in FIG. 1, according to another example embodiment. Referring to FIG. 21, the electronic device 500 includes the non-volatile memory device 10 and a central processing unit (CPU) 510 capable of controlling an operation of the non-volatile memory device 10.

The electronic device 500 includes a memory device 550 capable of being used as an operation memory of the CPU 510. The memory device 550 may be implemented into a non-volatile memory such as read only memory (ROM). A host connected to the electronic device 500 may transmit data to or receive the data from the non-volatile memory device 10 via a memory interface 520 and a host interface 540.

An error correction code (ECC) block 530 operating under the control of the CPU 510 may detect and correct an error included in the data read from the non-volatile memory device 10 via the memory interface 520.

The CPU 510 may control data exchange between the memory interface 520, the ECC block 530, the host interface 540, and the memory device 550 via a bus 501. The electronic device 500 may be implemented into a Universal Serial Bus (USB) memory drive or a memory stick.

Figure 22:
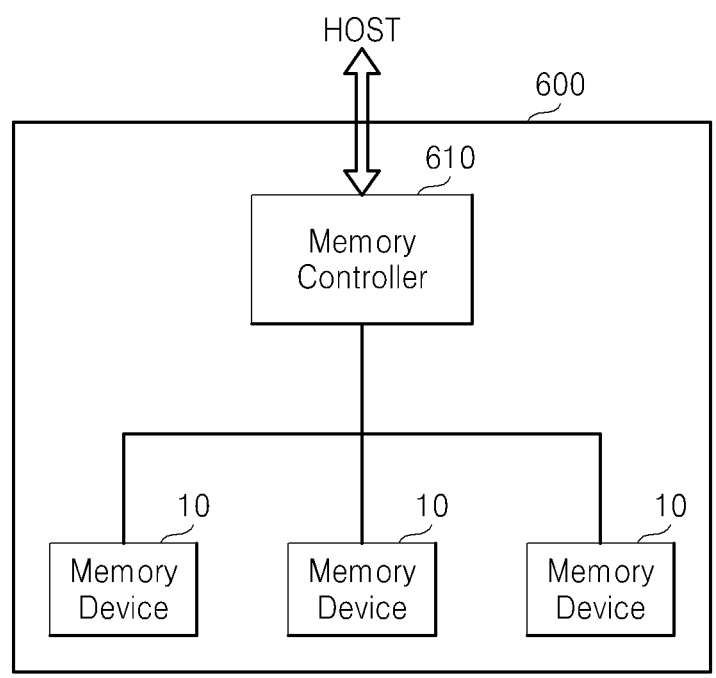
FIG. 22 is a block diagram showing an electronic device including the non-volatile memory device illustrated in FIG. 1, according to another example embodiment.

FIG. 22 is a block diagram showing an electronic device 600 including the non-volatile memory device 10 illustrated in FIG. 1, according to another example embodiment. Referring to FIG. 22, the electronic device 600 may be implemented into a data storage device such as a solid state drive (SSD). The electronic device 600 includes a plurality of non-volatile memory devices 10 and a memory controller 610 capable of controlling a data processing operation of each of the non-volatile memory devices 10. The electronic device 600 may be implemented into a memory system or a memory module.

Figure 23:
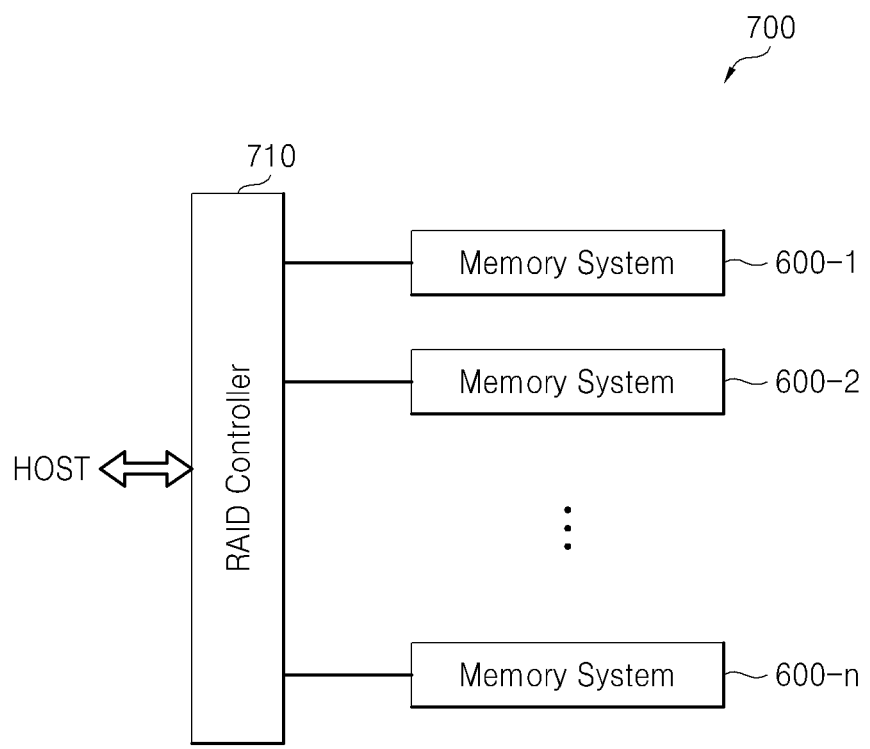
FIG. 23 is a block diagram showing a data processing device including the electronic device illustrated in FIG. 22, according to an example embodiment.

FIG. 23 is a block diagram showing a data processing device 700 including the electronic device 600 illustrated in FIG. 22, according to an example embodiment. Referring to FIGS. 22 and 23, the data processing device 700 capable of being implemented into a redundant array of independent disks (RAID) system may include a RAID controller 710 and a plurality of memory systems 600-1 through 600-n (where n denotes a natural number).

Each of the memory systems 600-1 through 600-n may be the memory system 600 shown in FIG. 22. The memory systems 600-1 through 600-n may constitute an RAID array. The data processing device 700 may be implemented into a personal computer (PC) or an SSD.

During a program operation, the RAID controller 710 may transmit program data output from a host to one of the memory systems 600-1 through 600-n according to one selected from the plurality of RAID levels according to the RAID level information. During a read operation, the RAID controller 710 may transmit to the host data read from one of the memory systems 600-1 through 600-n according to one selected from the plurality of RAID levels according to the RAID level information.

A non-volatile memory device according to an example embodiment may improve the integrity of data by storing the data like an SLC in a space of the spare region of the non-volatile memory device.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of programming multi-level cells included in a spare region, the method comprising:
    programming first page data and at least one first dummy data in a first multi-level cell; and
    programming second page data and at least one second dummy data in a second multi-level cell,
    wherein the programming in the first multi-level cell includes,
        programming the first page data as a first bit in the first multi-level cell,
        reading the first bit programmed in the first multi-level cell, and
        programming the first dummy data in the first multi-level cell as a second bit of the first multi-level cell according to the read first bit.

2. The method of claim 1, further comprising:
    programming third page data and at least one third dummy data in a third multi-level cell.

3. The method of claim 2, wherein the first page data, the second page data, and the third page data are sequentially programmed in the first multi-level cell, the second multi-level cell, and the third multi-level cell.

4. The method of claim 2, wherein the programming in the third multi-level cell comprises:
    reading data from the third multi-level cell being in an erased state;
    changing the read-out data to the third page data and storing the changed read-out data as the third dummy data and fourth dummy data in a plurality of latches connected to the third multi-level cell respectively; and
    programming the third page data and the third and fourth dummy data in the third multi-level cell as a first bit, a second bit, and a third bit of the third multi-level cell.

5. The method of claim 1, wherein the programming in the first multi-level cell further comprises programming third dummy data as a third bit in the first multi-level cell according to the first and second bits of the first multi-level cell.

6. The method of claim 1, wherein programming the second page data comprises:
    reading data from the second multi-level cell being in an erased state;
    changing the read-out data to the second page data and storing the changed read-out data as the second dummy data in a latch connected to the second multi-level cell; and
    programming the second page data and the second dummy data in the second multi-level cell as a first bit and a second bit of the second multi-level cell.

7. The method of claim 6, wherein the programming in the second multi-level cell further comprises programming third dummy data as a third bit in the second multi-level cell according to the first and second bits of the second multi-level cell.

8. A non-volatile memory device comprising:
    a spare region including a first multi-level cell and a second multi-level cell; and
    a control logic configured to control programming of first page data and at least one first dummy data in the first multi-level cell and programming of second page data and at least one second dummy data in the second multi-level cell,
    wherein the control logic includes,
        a page data control logic configured to control programming of the first page data in the first multi-level cell as a first bit of the first multi-level cell and reading of the first bit of the first multi-level cell; and
        a dummy data control logic configured to control programming of the first dummy data in the first multi-level cell as a second bit of the first multi-level cell according to the read first bit.

9. The non-volatile memory device of claim 8, wherein, the spare region further includes a third multi-level cell, and the control logic is configured to control programming of third page data and at least one third dummy data in the third multi-level cell.

10. The non-volatile memory device of claim 9, wherein the control logic is configured to control programming of the first page data, the second page data, and the third page data such that the first page data, the second page data, and the third page data are sequentially programmed in the first multi-level cell, the second multi-level cell, and the third multi-level cell.

11. The non-volatile memory device of claim 9, wherein the control logic comprises:
    a dummy data control logic configured to control reading out of data of the third multi-level cell in an erased state, configured to control changing of the read-out data to be changed to the third page data, and configured to control the changed read-out data to be stored as the third dummy data and fourth dummy data in a plurality of latches connected to the third multi-level cell; and
    a page data control logic configured to control programming of the third page data and the third and sixth dummy data in the third multi-level cell as a first bit, a second bit, and a third bit of the third multi-level cell.

12. The non-volatile memory device of claim 8, wherein the dummy data control logic is configured to control programming of third dummy data in the first multi-level cell as a third bit of the first multi-level cell according to the first and second bits.

13. The non-volatile memory device of claim 8, wherein the control logic comprises:
   a dummy data control logic configured to control reading out of data of the second multi-level cell in an erased state, configured to control changing of the read-out data to the second page data, and configured to control storing of the changed read-out data as the second dummy data in a latch connected to the second multi-level cell; and
   a page data control logic configured to control programming of the second page data and the second dummy data in the second multi-level cell as a first bit and a second bit of the second multi-level cell.

14. The non-volatile memory device of claim 13, wherein the dummy data control logic is configured to control programming of third dummy data as a third bit in the second multi-level cell according to the first and second bits.

15. An electronic device comprising:
   a non-volatile memory device; and
   a processor capable of controlling an operation of the non-volatile memory device,
   wherein the non-volatile memory device includes
      a spare region including a first multi-level cell and a second multi-level cell; and
      a control logic configured to control programming of first page data and at least one first dummy data in the first multi-level cell and programming of second page data and at least one second dummy data in the second multi-level cell,
   wherein the control logic includes,
      a page data control logic configured to control programming of the first page data as a first bit in the first multi-level cell and configured to control reading of the first bit programmed in the first multi-level cell, and
      a dummy data control logic configured to control programming of the first dummy data as a second bit in the first multi-level cell according to the read first bit.

16. The electronic device of claim 15, wherein, the spare region further includes a third multi-level cell, and the control logic is configured to control programming of third page data and at least one third dummy data in the third multi-level cell.

17. The electronic device of claim 16, wherein the control logic is configured to control sequential programming of the first page data, the second page data, and the third page data in the first multi-level cell, the second multi-level cell, and the third multi-level cell.

* * * * *